US012745804B2

(12) United States Patent
Lee et al.

(10) Patent No.: US 12,745,804 B2
(45) Date of Patent: Sep. 29, 2026

(54) AEROSOL GENERATING APPARATUS AND METHOD OF CONTROLLING THE SAME

(71) Applicant: KT&G CORPORATION, Daejeon (KR)

(72) Inventors: Won Kyeong Lee, Guri-si (KR); Byung Sung Cho, Gwangmyeong-si (KR); Min Kyu Kim, Daejeon (KR); Jong Sub Lee, Seongnam-si (KR)

(73) Assignee: KT&G CORPORATION, Daejeon (KR)

( * ) Notice: Subject to any disclaimer, the term of this patent is extended or adjusted under 35 U.S.C. 154(b) by 860 days.

(21) Appl. No.: 17/294,495

(22) PCT Filed: Apr. 12, 2021

(86) PCT No.: PCT/KR2021/004570
§ 371 (c)(1),
(2) Date: May 17, 2021

(87) PCT Pub. No.: WO2021/210866
PCT Pub. Date: Oct. 21, 2021

(65) Prior Publication Data
US 2023/0148676 A1 May 18, 2023

(30) Foreign Application Priority Data
Apr. 13, 2020 (KR) ........................ 10-2020-0044779

(51) Int. Cl.
*A24F 40/53* (2020.01)
*A24F 40/10* (2020.01)
(Continued)

(52) U.S. Cl.
CPC .............. *A24F 40/53* (2020.01); *A24F 40/10* (2020.01); *A24F 40/42* (2020.01); *A24F 40/44* (2020.01);
(Continued)

(58) Field of Classification Search
CPC ....................................................... A24F 40/53
See application file for complete search history.

(56) References Cited

U.S. PATENT DOCUMENTS 10,201,186 B2 * 2/2019 Alarcon ............... H05B 1/0227
2014/0014126 A1 * 1/2014 Peleg ...................... A24F 40/10
374/54
(Continued)

FOREIGN PATENT DOCUMENTS

CN 103338665 A 10/2013
CN 204147375 U * 2/2015 ........... A24B 15/167
(Continued)

OTHER PUBLICATIONS

English machine translation of CN-204147375-U translated by PE2E search, 2015 (Year: 2015).*
(Continued)

*Primary Examiner* — Michael H. Wilson
*Assistant Examiner* — Michael T Fulton
(74) *Attorney, Agent, or Firm* — Sughrue Mion, PLLC

(57) ABSTRACT

An aerosol generating apparatus according to an aspect includes a cartridge for accommodating an aerosol generating material, a processor, and an electronic circuit connected to the cartridge and the processor, wherein the processor detects a remaining amount of the aerosol generating material by using a fixed resistor included in the electronic circuit.

6 Claims, 10 Drawing Sheets

(51) Int. Cl.

| | |
|---|---|
| ***A24F 40/42*** | (2020.01) |
| ***A24F 40/44*** | (2020.01) |
| ***A24F 40/46*** | (2020.01) |
| ***A24F 40/60*** | (2020.01) |
| ***H03K 3/017*** | (2006.01) |

(52) U.S. Cl.

CPC .............. *A24F 40/46* (2020.01); *A24F 40/60* (2020.01); *H03K 3/017* (2013.01)

(56) References Cited

U.S. PATENT DOCUMENTS

| | | | | |
|---|---|---|---|---|
| 2014/0020693 | A1 | 1/2014 | Cochand et al. | |
| 2017/0099878 | A1* | 4/2017 | Murison | A24F 15/015 |
| 2017/0238596 | A1 | 8/2017 | Matsumoto et al. | |
| 2017/0238610 | A1 | 8/2017 | Reevell | |
| 2017/0245553 | A1* | 8/2017 | Reevell | H05B 3/04 |
| 2019/0274361 | A1 | 9/2019 | Bilat et al. | |
| 2019/0319445 | A1* | 10/2019 | Ye | H02H 1/0007 |
| 2019/0350257 | A1 | 11/2019 | Sur | |
| 2020/0237010 | A1 | 7/2020 | Yamada et al. | |
| 2020/0237013 | A1 | 7/2020 | Yamada et al. | |
| 2021/0084985 | A1 | 3/2021 | Akao et al. | |
| 2021/0145073 | A1 | 5/2021 | Lee et al. | |

FOREIGN PATENT DOCUMENTS

| | | | | |
|---|---|---|---|---|
| CN | 107249360 | A | 10/2017 | |
| CN | 110613176 | A | 12/2019 | |
| EP | 3365051 | A0 | 8/2018 | |
| JP | 2019-509727 | A | 4/2019 | |
| KR | 10-1996-0014764 | A | 5/1996 | |
| KR | 10-2019-0035478 | A | 4/2019 | |
| WO | 2012085203 | A1 | 6/2012 | |
| WO | 2016/119145 | A1 | 8/2016 | |
| WO | WO-2016175459 | A1 * | 11/2016 | A24F 40/40 |
| WO | 2017/045899 | A1 | 3/2017 | |
| WO | 2017070039 | A1 | 4/2017 | |
| WO | 2017/144191 | A1 | 8/2017 | |
| WO | 2017/144380 | A1 | 8/2017 | |
| WO | 2018/202403 | A1 | 11/2018 | |
| WO | 2019/082280 | A1 | 5/2019 | |
| WO | 2019/082282 | A1 | 5/2019 | |
| WO | 2019/239548 | A1 | 12/2019 | |

OTHER PUBLICATIONS

English machine translation of WO-2016175459-A1 translated by PE2E search 2016 (Year: 2016).*

Communication dated Sep. 13, 2022 from the Japanese Patent Office in Application No. 2021-549722.

Extended European Search Report issued Feb. 8, 2022 in European Application No. 21726027.2.

Korean Office Action issued Jul. 2, 2023 in Application No. 10-2022-0093459.

Office Action issued May 8, 2023 in Chinese Application No. 202180001668.6.

Office Action issued Mar. 22, 2023 in Japanese Application No. 2021-549722.

International Search Report issued Jul. 21, 2021 in International Application No. PCT/KR2021/004570.

Korean Office Action dated Jan. 9, 2024 in Application No. 10-2022-0093459.

* cited by examiner

【 FIG 1 】
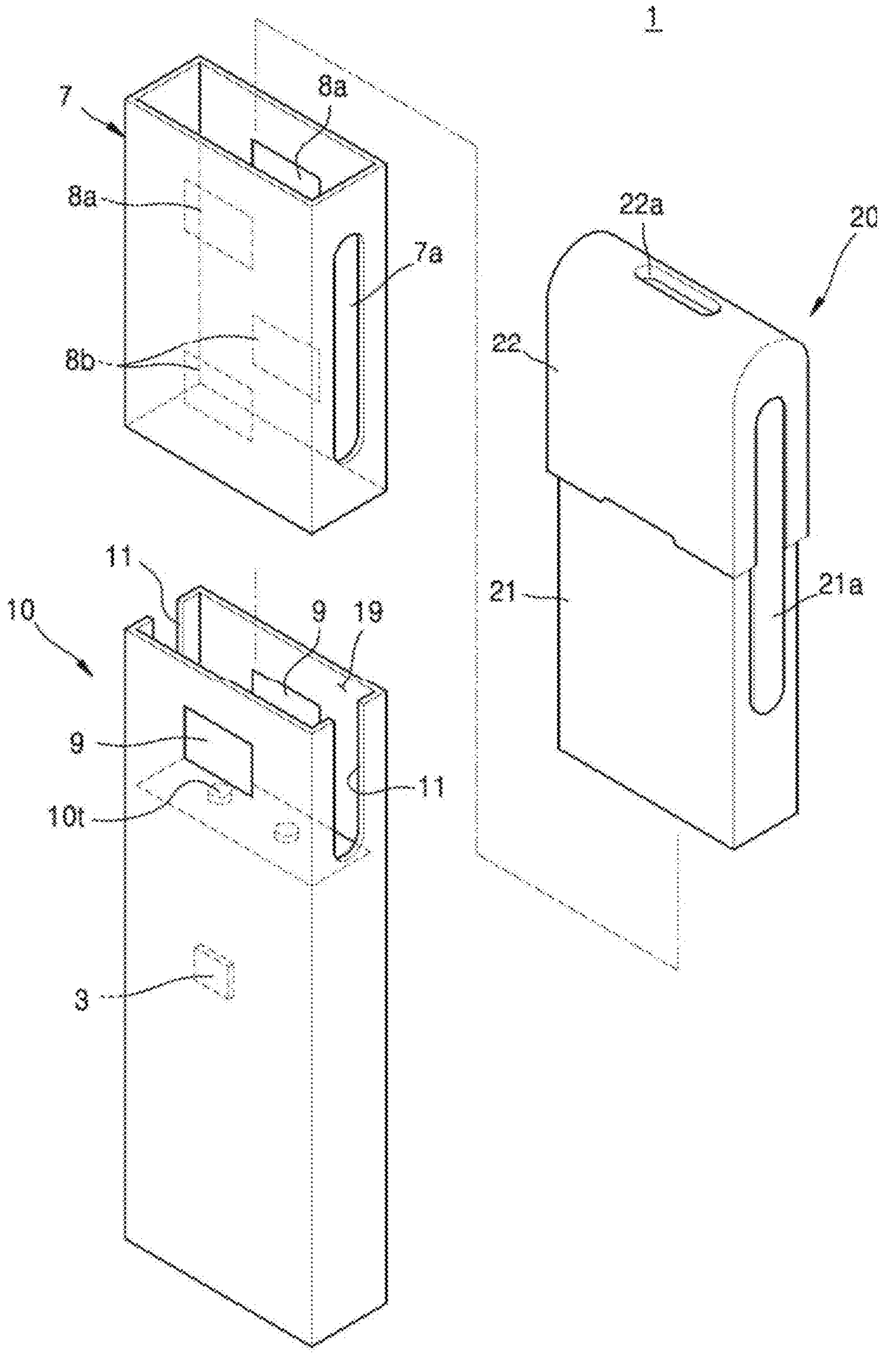

【 FIG 2 】
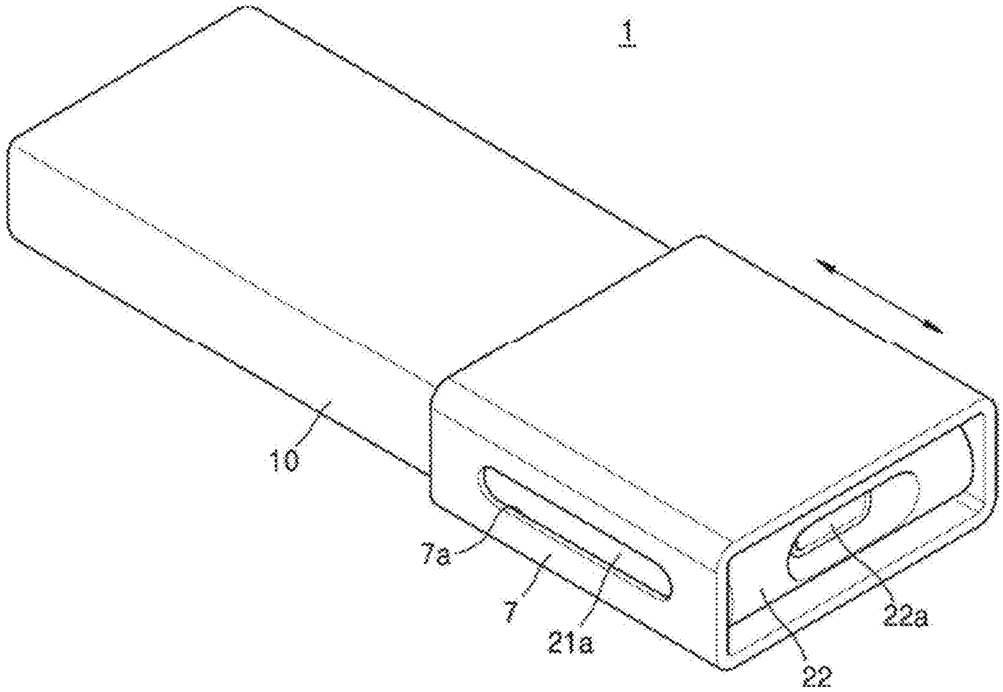

【 FIG 3 】
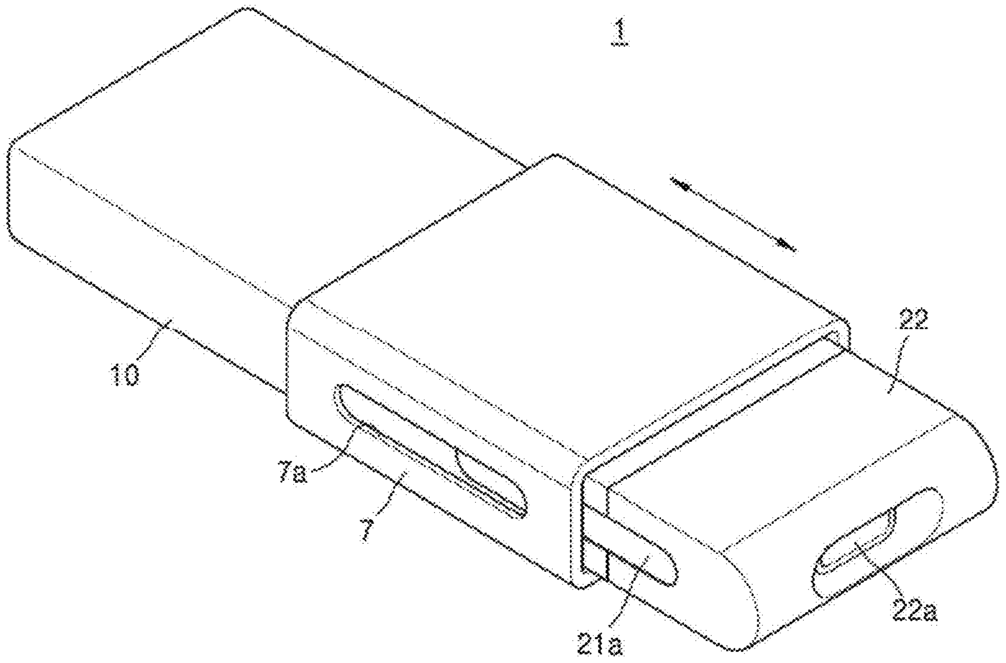

【 FIG 4 】
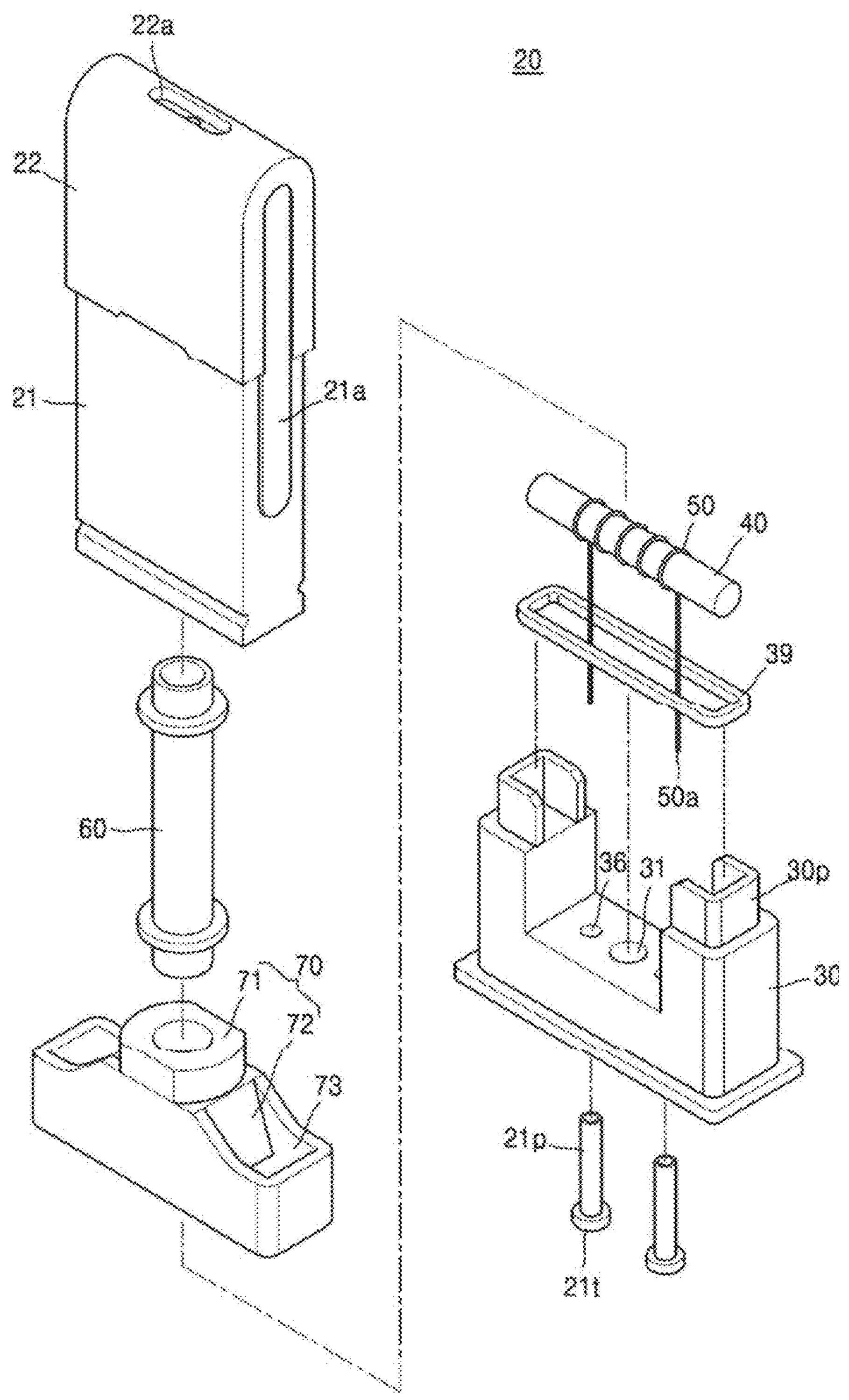

【 FIG 5 】
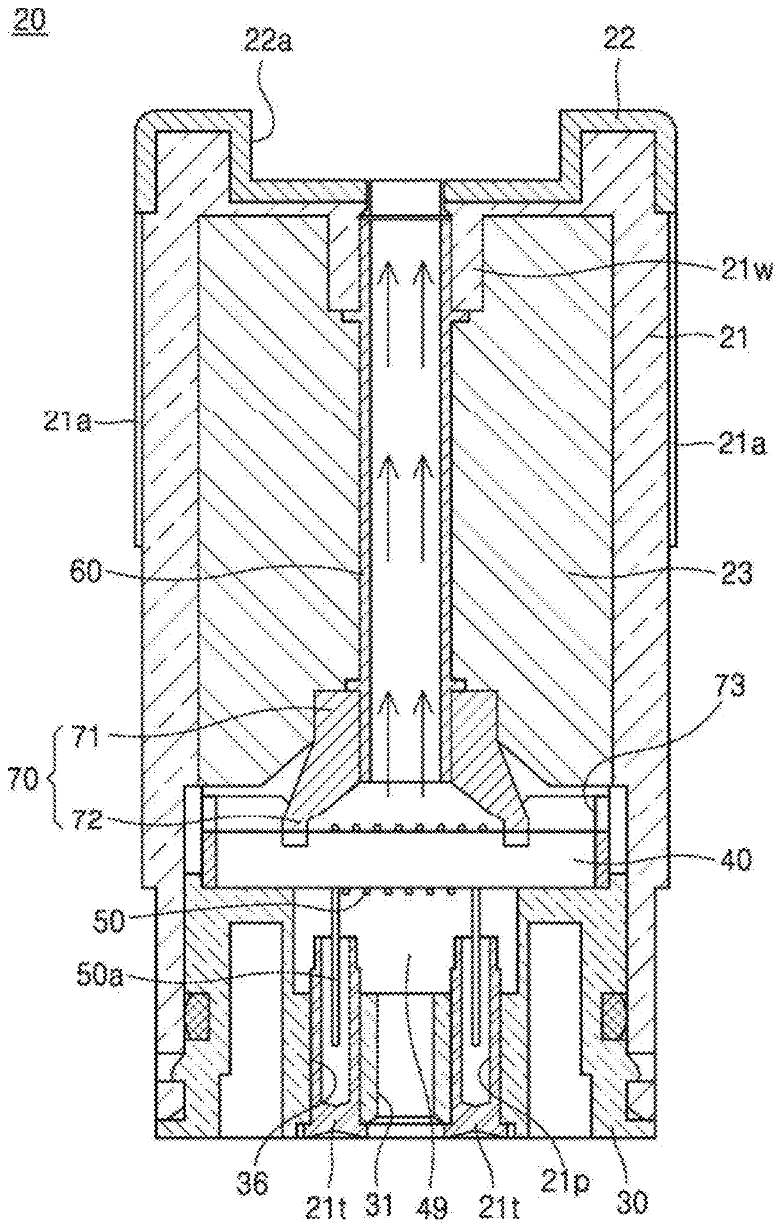

【 FIG 6 】
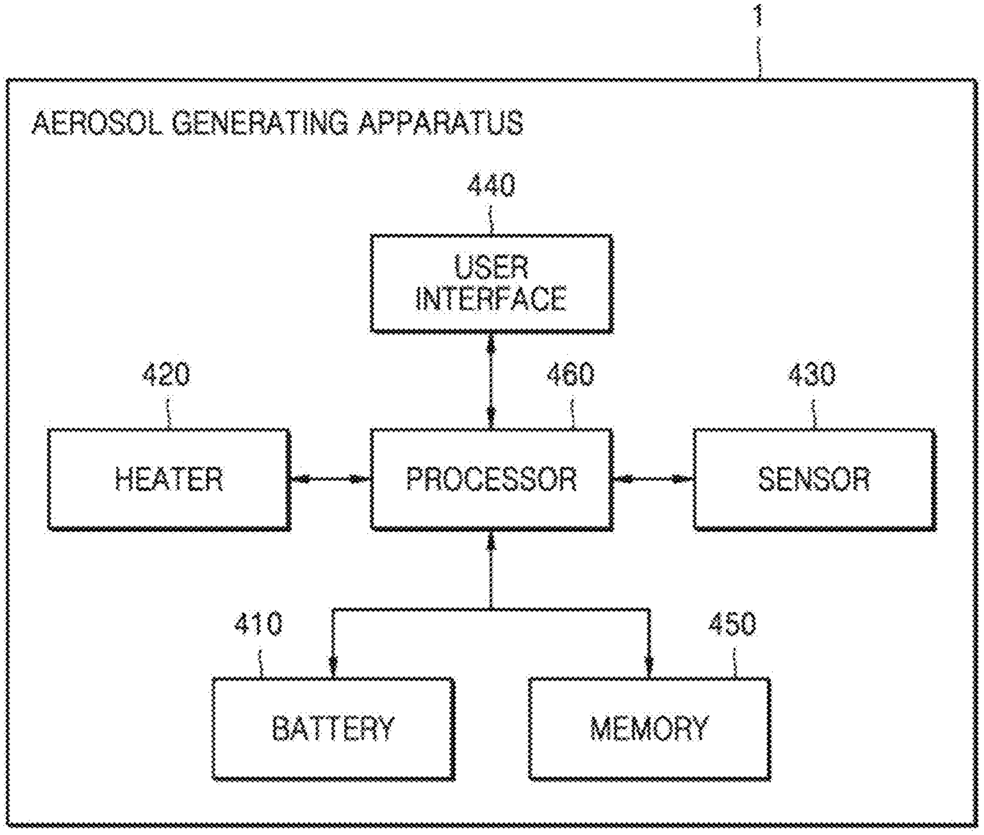

【 FIG 7 】
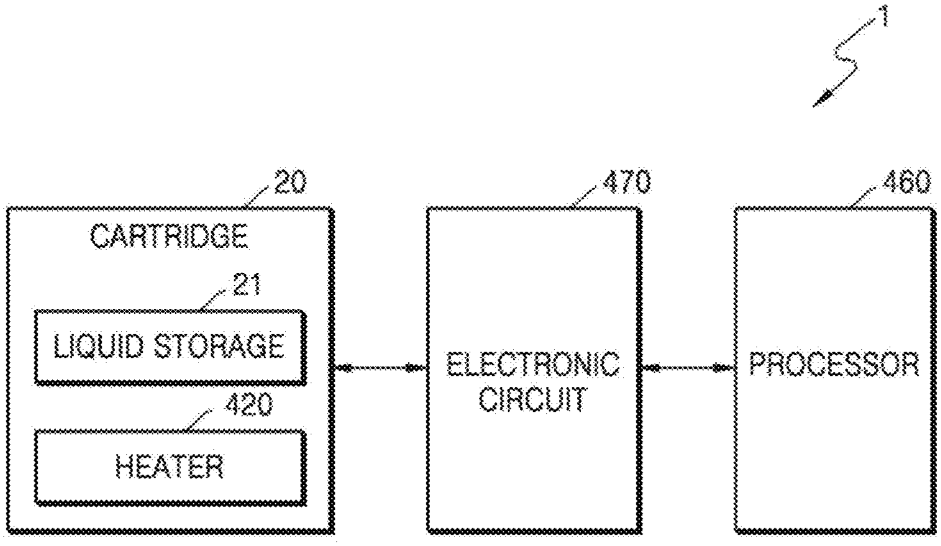

[ FIG 8 ]
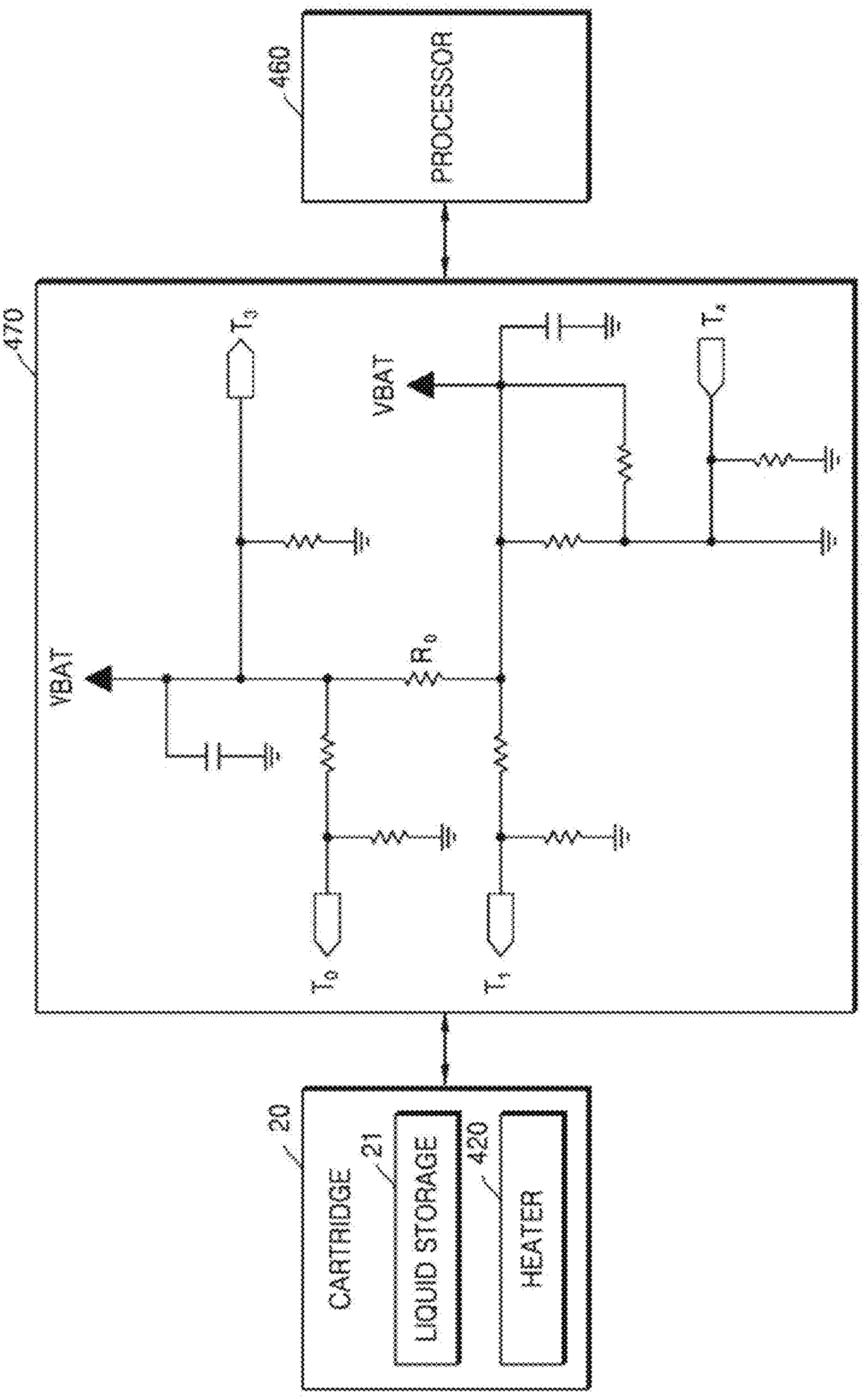

【 FIG 9 】
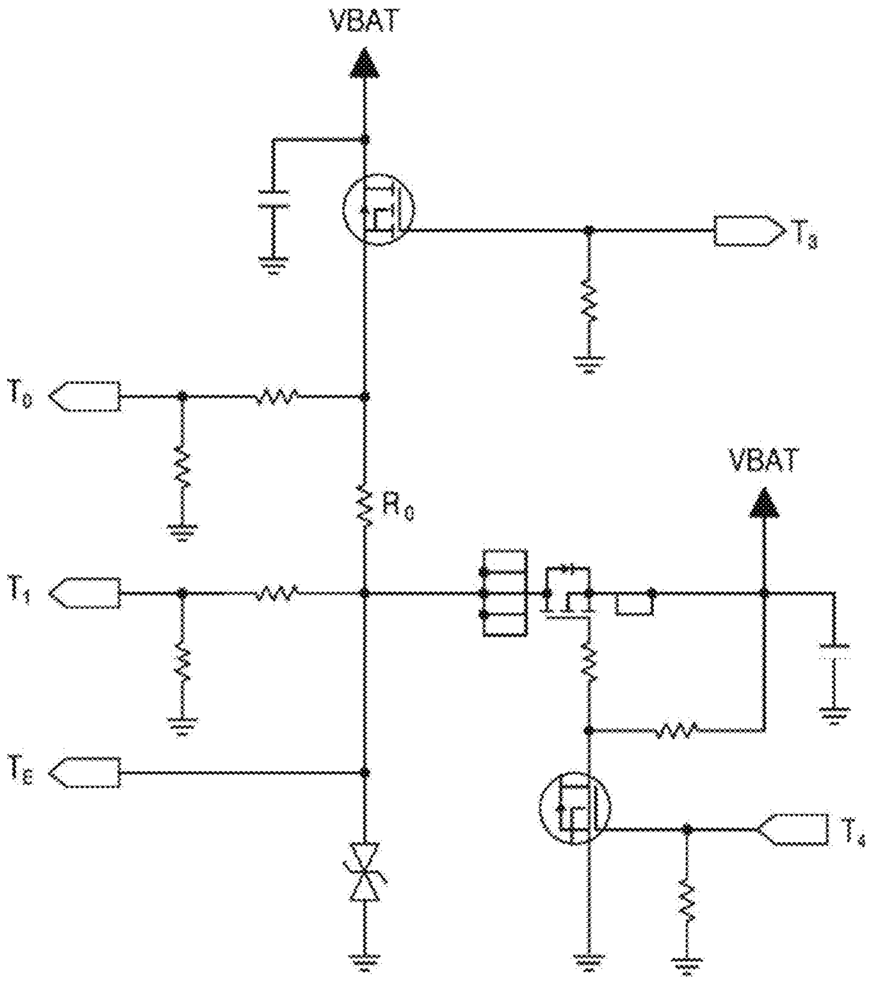

【 FIG 10 】
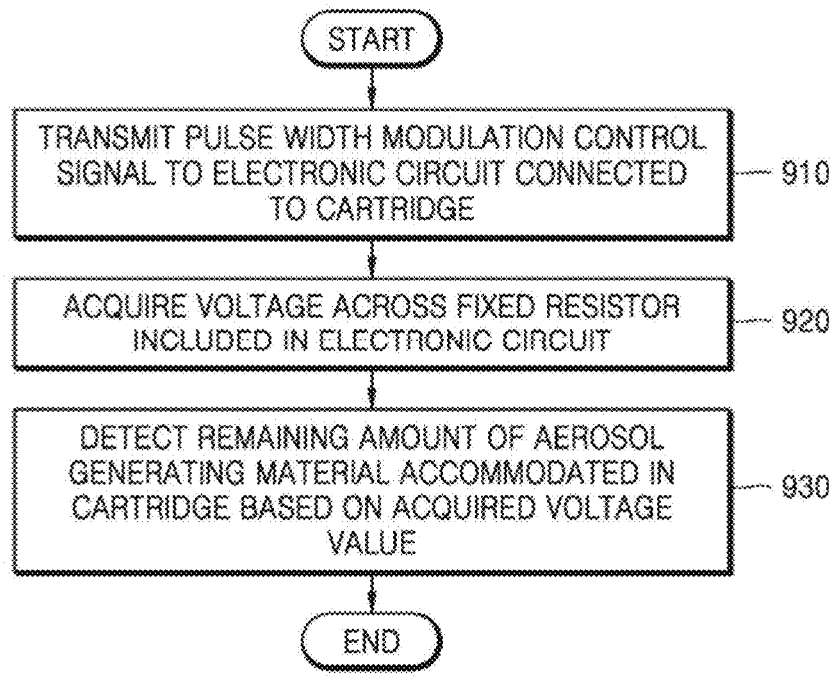

AEROSOL GENERATING APPARATUS AND METHOD OF CONTROLLING THE SAME

CROSS REFERENCE TO RELATED APPLICATIONS

This application is a National Stage of International Application No. PCT/KR2021/004570 filed Apr. 12, 2021, claiming priority based on Korean Patent Application No. 10-2020-0044779 filed Apr. 13, 2020.

TECHNICAL FIELD

The present disclosure relates to an aerosol generating apparatus and a method of controlling the aerosol generating apparatus.

BACKGROUND ART

Recently, the demand for an alternative to traditional combustive cigarettes has increased. For example, there is growing demand for an aerosol generating apparatus that generates an aerosol by heating an aerosol generating material in cigarettes without combustion. Accordingly, research into a heating-type cigarette or a heating-type aerosol generating apparatus is being actively conducted.

DISCLOSURE OF INVENTION

Technical Problem

There is a need for an aerosol generating apparatus to detect the remaining amount of aerosol generating material more accurately.

Solution to Problem

An aerosol generating apparatus according to an aspect includes a cartridge for accommodating an aerosol generating material, a processor, and an electronic circuit connected to the cartridge and the processor, wherein the processor detects a remaining amount of the aerosol generating material by using a fixed resistor included in the electronic circuit.

A method of controlling an aerosol generating apparatus according to another aspect includes transmitting a pulse width modulation control signal to an electronic circuit connected to a cartridge, acquiring a voltage across a fixed resistor included in the electronic circuit, and detecting a remaining amount of an aerosol generating material accommodated in the cartridge based on the acquired voltage.

A computer-readable recording medium according to another aspect includes a recording medium in which a method of performing the above-described method by using a computer is recorded.

Advantageous Effects of Invention

An aerosol generating apparatus detects a remaining amount of an aerosol generating material by using an internal fixed resistor of which resistance does not change by temperature. Accordingly, even when a temperature of a heater included in the aerosol generating device varies due to an external factor that does not involve consumption of the aerosol generating material, an aerosol generating apparatus may accurately detect a remaining amount of an aerosol generating material.

BRIEF DESCRIPTION OF DRAWINGS

FIG. 1 is an exploded perspective view schematically showing an example of a coupling relationship between a cartridge and an aerosol generating apparatus according to an embodiment.

FIG. 2 is a perspective view of an exemplary operating state of the aerosol generating device according to the embodiment illustrated in FIG. 1.

FIG. 3 is a perspective view of another exemplary operating state of the aerosol generating device according to the embodiment illustrated in FIG. 1.

FIGS. 4A and 4B are views showing an example of a cartridge according to an embodiment.

FIG. 5 is a block diagram showing an example of hardware of an aerosol generating apparatus according to an embodiment.

FIG. 6 is a block diagram showing an example of an aerosol generating apparatus according to an embodiment.

FIG. 7 is a diagram showing an example of an electronic circuit according to an embodiment.

FIG. 8 is a diagram showing another example of the electronic circuit according to the embodiment, FIG. 9 is a flowchart showing an example of a method of controlling an aerosol generating apparatus, according to an embodiment.

BEST MODE FOR CARRYING OUT THE INVENTION

An aerosol generating apparatus according to an aspect may include a cartridge for accommodating an aerosol generating material, a processor, and an electronic circuit connected to the cartridge and the processor, wherein the processor may detect a remaining amount of the aerosol generating material by using a fixed resistor included in the electronic circuit.

In addition, the processor may detect the remaining amount based on a voltage value across the fixed resistor.

In addition, a resistance value of the fixed resistor may be independent of a temperature of a heater included in the cartridge.

In addition, the electronic circuit may include a first terminal for transmitting a first signal for controlling power supplied to a heater and a second terminal for transmitting a second signal for controlling power supplied to the fixed resistor.

In addition, the first signal may a first pulse width modulation (PWM) signal.

In addition, the second signal may be a PWM signal.

In addition, a resistance value of the fixed resistor may be less than or equal to 5Ω.

In addition, the processor may generate a notification signal when the aerosol generating material is depleted in the cartridge.

In addition, the cartridge may include a heater for vaporizing the aerosol generating material, and a liquid delivery element for delivering the aerosol generating material to the heater, wherein the heater may be wound around an outer circumferential surface of the liquid delivery element.

A method of controlling an aerosol generating apparatus according to another aspect may include transmitting a pulse width modulation (PWM) control signal to an electronic circuit connected to a cartridge that accommodates an aerosol generating material, acquiring a voltage value across a fixed resistor included in the electronic circuit, and detecting a remaining amount of an aerosol generating material accommodated in the cartridge based on the acquired voltage value.

In addition, a resistance value of the fixed resistor may be independent of a temperature of a heater included in the aerosol generating apparatus.

In addition, the method may further include generating a notification signal when the aerosol generating material is depleted in the cartridge.

A computer-readable recording medium according to another aspect may record a program for performing the method of controlling the aerosol generating apparatus according to another aspect by using a computer.

MODE FOR THE INVENTION

Hereinafter, embodiments of the present disclosure will be described in detail with reference to the accompanying drawings so that the skilled in the art in which the present disclosure belongs may easily implement the present disclosure. The present disclosure may, however, be embodied in many different forms and should not be construed as being limited to the embodiments set forth herein.

With respect to the terms used to describe the various embodiments, general terms which are currently and widely used are selected in consideration of functions of structural elements in the various embodiments of the present disclosure. However, meanings of the terms can be changed according to intention, a judicial precedence, the appearance of new technology, and the like. In addition, in certain cases, a term which is not commonly used can be selected. In such a case, the meaning of the term will be described in detail at the corresponding portion in the description of the present disclosure. Therefore, the terms used in the various embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Hereinafter, the present disclosure will now be described more fully with reference to the accompanying drawings, in which exemplary embodiments of the present disclosure are shown such that one of ordinary skill in the art may easily work the present disclosure. The disclosure may, however, be embodied in many different forms and should not be construed as being limited to the embodiments set forth herein.

In addition, terms including ordinal numbers such as "first" or "second" used in the present specification may be used to describe various components, but the components should not be limited by the terms. The terms are used only for the purpose of distinguishing one component from another component.

The term "aerosol generating article" may refer to any article that is designed for smoking by a person puffing on the aerosol generating article. The aerosol generating article may include an aerosol generating material that generates aerosols when heated even without combustion. For example, one or more aerosol generating articles may be loaded in an aerosol generating device and generate aerosols when heated by the aerosol generating device. The shape, size, material, and structure of the aerosol generating article may differ according to embodiments. Examples of the aerosol generating article may include, but are not limited to, a cigarette-shaped substrate and a cartridge. Hereinafter, the term "cigarette" (i.e., when used alone without a modifier such as "general," "traditional," or "combustive") may refer to an aerosol generating article which has a shape similar to a traditional combustive cigarette.

Hereinafter, embodiments of the present disclosure will be described in detail with reference to the drawings.

FIG. 1 is an exploded perspective view schematically showing an example of a coupling relationship between a cartridge and an aerosol generating apparatus according to an embodiment.

An aerosol generating device 1 according to the embodiment illustrated in FIG. 1 includes the cartridge 20 containing the aerosol generating material and a main body 10 supporting the cartridge 20.

The cartridge 20 may be coupled to the main body 10 in a state in which the aerosol generating material is accommodated therein. A portion of the cartridge 20 is inserted into an accommodation space 19 of the main body 10 so that the cartridge 20 may be mounted on the main body 10.

The cartridge 20 may contain an aerosol generating material in any one of, for example, a liquid state, a solid state, a gaseous state, or a gel state. The aerosol generating material may include a liquid composition. For example, the liquid composition may be a liquid including a tobacco-containing material having a volatile tobacco flavor component, or a liquid including a non-tobacco material.

For example, the liquid composition may include one component of water, solvents, ethanol, plant extracts, spices, flavorings, and vitamin mixtures, or a mixture of these components. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. In addition, the liquid composition may include an aerosol forming agent such as glycerin and propylene glycol.

For example, the liquid composition may include any weight ratio of glycerin and propylene glycol solution to which nicotine salts are added. The liquid composition may include two or more types of nicotine salts. Nicotine salts may be formed by adding suitable acids, including organic or inorganic acids, to nicotine. Nicotine may be a naturally generated nicotine or synthetic nicotine and may have any suitable weight concentration relative to the total solution weight of the liquid composition.

Acid for the formation of the nicotine salts may be appropriately selected in consideration of the rate of nicotine absorption in the blood, the operating temperature of the aerosol generating device 1, the flavor or savor, the solubility, or the like. For example, the acid for the formation of nicotine salts may be a single acid selected from the group consisting of benzoic acid, lactic acid, salicylic acid, lauric acid, sorbic acid, levulinic acid, pyruvic acid, formic acid, acetic acid, propionic acid, butyric acid, valeric acid, caproic acid, caprylic acid, capric acid, citric acid, myristic acid, palmitic acid, stearic acid, oleic acid, linoleic acid, linolenic acid, phenylacetic acid, tartaric acid, succinic acid, fumaric acid, gluconic acid, saccharic acid, malonic acid or malic acid, or a mixture of two or more acids selected from the group, but is not limited thereto.

The cartridge 20 is operated by an electrical signal or a wireless signal transmitted from the main body 10 to perform a function of generating aerosol by converting the phase of the aerosol generating material inside the cartridge 20 to a gaseous phase. The aerosol may refer to a gas in which vaporized particles generated from an aerosol generating material are mixed with air.

For example, the cartridge 20 may convert the phase of the aerosol generating material by receiving the electrical signal from the main body 10 and heating the aerosol generating material, or by using an ultrasonic vibration method, or by using an induction heating method. As another example, when the cartridge 20 includes its own power source, the cartridge 20 may generate the aerosol by being operated by an electric control signal or a wireless signal transmitted from the main body 10 to the cartridge 20.

The cartridge 20 may include a liquid storage 21 accommodating the aerosol generating material therein, and an atomizer performing a function of converting the aerosol generating material of the liquid storage 21 to the aerosol.

When the liquid storage 21 "accommodates the aerosol generating material" therein, it means that the liquid storage 21 functions as a container simply holding an aerosol generating material and that the liquid storage 21 includes therein an element containing an aerosol generating material, such as a sponge, cotton, fabric, or porous ceramic structure.

The atomizer may include, for example, a liquid delivery element (e.g., wick) for absorbing the aerosol generating material and maintaining the same in an optimal state for conversion to aerosol, and a heater heating the liquid delivery element to generate aerosol.

The liquid delivery element may include at least one of, for example, a cotton fiber, a ceramic fiber, a glass fiber, and porous ceramic.

The heater may include a metallic material such as copper, nickel, tungsten, or the like to heat the aerosol generating material delivered to the liquid delivery element by generating heat using electrical resistance. The heater may be implemented by, for example, a metal wire, a metal plate, a ceramic heating element, or the like. Also, the heater may be implemented by a conductive filament using a material such as a nichrome wire, and may be wound around or arranged adjacent to the liquid delivery element.

In addition, the atomizer may be implemented by a heating element in the form of a mesh or plate, which absorbs the aerosol generating material, maintains the same in an optimal state for conversion to aerosol, and generates an aerosol by heating the aerosol generating material. In this case, a separate liquid delivery element may not be required.

At least a portion of the liquid storage 21 of the cartridge 20 may include a transparent portion so that the aerosol generating material accommodated in the cartridge 20 may be visually identified from the outside. The liquid storage 21 includes a protruding window 21*a* protruding from the liquid storage 21, so that the liquid storage 21 may be inserted into a groove 11 of the main body 10 when coupled to the main body 10. A mouthpiece 22 and/or the liquid storage 21 may be entirely formed of transparent plastic or glass. Alternatively, only the protruding window 21*a* may be formed of a transparent material.

The main body 10 includes a connection terminal 10*t* arranged inside the accommodation space 19. When the liquid storage 21 of the cartridge 20 is inserted into the accommodation space 19 of the main body 10, the main body 10 may provide power to the cartridge 20 or supply a signal related to an operation of the cartridge 20 to the cartridge 20, through the connection terminal 10*t*.

The mouthpiece 22 is coupled to one end of the liquid storage 21 of the cartridge 20. The mouthpiece 22 is a portion of the aerosol generating device 1, which is to be inserted into a user's mouth. The mouthpiece 22 includes a discharge hole 22*a* for dis-charging aerosol generated from the aerosol generating material inside the liquid storage 21 to the outside.

The slider 7 is coupled to the main body 10 in such a way that the slider 7 may move along the main body 10. The slider 7 covers or exposes at least a portion of the mouthpiece 22 of the cartridge 20 coupled to the main body 10 by moving with respect to the main body 10. The slider 7 includes an elongated hole 7*a* exposing at least a portion of the protruding window 21*a* of the cartridge 20 to the outside.

As shown FIG. 1, the slider 7 may have a shape of a hollow container with both ends opened, but the structure of the slider 7 is not limited thereto. For example, the slider 7 may have a bent plate structure having a clip-shaped cross-section, which is movable with respect to the main body 10 while being coupled to an edge of the main body 10. In another example, the slider 7 may have a curved semi-cylindrical shape with a curved arc-shaped cross section.

The slider 7 may include a magnetic body for maintaining the position of the slider 7 with respect to the main body 10 and the cartridge 20. The magnetic body may include a permanent magnet or a material such as iron, nickel, cobalt, or an alloy thereof.

The magnetic body may include two first magnetic bodies Sa facing each other, and two second magnetic bodies 8*b* facing each other. The first magnetic bodies Sa may be spaced apart from the second magnetic bodies 8*b* in a longitudinal direction of the main body 10 (i.e., the direction in which the main body 10 extends), which is a moving direction of the slider 7.

The main body 10 includes a fixed magnetic body 9 arranged on a path along which the first magnetic bodies 8*a* and the second magnetic bodies 8*b* of the slider 7 move as the slider 7 moves with respect to the main body 10. Two fixed magnetic bodies 9 of the main body 10 may be mounted to face each other with the accommodation space 19 therebetween.

Depending on the position of the slider 7, an end of the mouthpiece 22 is covered or exposed by a magnetic force acting between the fixed magnetic body 9 and the first magnetic body 8*a* or between the fixed magnetic body 9 and the second magnetic body 8*b*.

The main body 10 includes a position change detecting sensor 3 arranged on the path along which the first magnetic body Sa and the second magnetic body 8*b* of the slider 7 move as the slider 7 moves with respect to the main body 10. The position change detecting sensor 3 may include, for example, a Hall integrated circuit (IC) that uses the Hall effect to detect a change in a magnetic field, and may generate a signal based on the detected change.

In the aerosol generating device 1 according to the above-described embodiments, the main body 10, the cartridge 20, and the slider 7 have approximately rectangular cross-sectional shapes when cut perpendicular to the longitudinal direction, but the shape of the aerosol generating device 1 is not limited. The aerosol generating device 1 may have, for example, a cross-sectional shape of a circle, an ellipse, a square, or a polygon of various shapes. In addition, the aerosol generating device 1 may not extend linearly in the longitudinal direction, and may have a curved or a bent portion to be easily held by the user.

FIG. 2 is a perspective view of an exemplary operating state of the aerosol generating device according to the embodiment illustrated in FIG. 1.

In FIG. 2, the slider 7 is moved to a position where the end of the mouthpiece 22 of the cartridge coupled to the main body 10 is covered. In this state, the mouthpiece 22 may be safely protected from external impurities and kept clean.

The user may check the remaining amount of aerosol generating material contained in the cartridge by visually checking the protruding window 21*a* of the cartridge through the elongated hole 7*a* of the slider 7. The user may move the slider 7 in the longitudinal direction of the main body 10 to use the aerosol generating device 1.

FIG. 3 is a perspective view of another exemplary operating state of the aerosol generating device according to the embodiment illustrated in FIG. 1.

In FIG. 3, the operating state is shown in which the slider 7 is moved to a position where the end of the mouthpiece 22 of the cartridge coupled to the main body 10 is exposed to the outside. In this state, the user may insert the mouthpiece 22 into his or her mouth and inhale aerosol discharged through the discharge hole 22*a* of the mouthpiece 22.

As shown in FIG. 3, the protruding window 21*a* of the cartridge is still exposed to the outside through the elongated hole 7*a* of the slider 7 when the slider 7 is moved to the position where the end of the mouthpiece 22 is exposed to the outside. Thus, the user may visually check the remaining amount of aerosol generating material contained in the cartridge, regardless of the position of the slider 7.

FIGS. 4A and 4B are diagrams showing an example of a cartridge according to an embodiment.

FIG. 4A is an exploded perspective view schematically showing a cartridge according to an embodiment, and FIG. 4B is a cross-sectional view of the cartridge shown in FIG. 4A.

Referring to FIGS. 4A and 4B, the cartridge 20 may include the liquid storage 21 and an atomizer as described above.

The atomizer includes a heater 50 that generates an aerosol by heating an aerosol generating material, a lower cap 30 that forms a chamber 49 in which an aerosol may be generated, and a liquid delivery element 40 that is arranged in the chamber 49 of the lower cap 30. The liquid delivery element 40 may absorb an aerosol generating material contained in the storage space 23. The liquid delivery element 40 may maintain a state in which the aerosol generating material is absorbed, and when the liquid delivery element 40 is heated by the heater 50, the aerosol generating material held in the liquid delivery element 40 is vaporized, resulting in generation of an aerosol.

Structures of the heater 50, the lower cap 30, and the liquid delivery element 40 shown in FIGS. 4A and 4B are examples and may be modified in various forms. For example, the heater 50 may be arranged adjacent to the liquid delivery element 40 without being wound around the liquid delivery element 40. Also, a structure of the liquid delivery element 40 may be deformed into a mesh shape or a plate shape, and the heater SO and the liquid delivery element 40 may be integrated into one component. For example, the heater 50 and the liquid delivery element 40 may be formed as a metal heater of a mesh shape).

The mouthpiece 22 is coupled to one end (i.e., top end) of the liquid storage 21, and the lower cap 30 is coupled to the other end of the liquid storage 21. The lower cap 30 may support the liquid delivery element 40 and the heater 50 and seal the other end of the liquid storage 21. The lower cap 30 may include the support jaws 30*p* for supporting both ends of the liquid delivery element 40.

The lower cap 30 may be inserted into the other end (i.e., bottom end) of the liquid storage 21. A sealing ring 39 formed of an elastic material such as rubber or silicone may be arranged between the lower cap 30 and the liquid storage 21 to improve sealing performance.

In addition, the lower cap 30 includes an air path 31 for delivering air to a chamber 49. External air may pass through the air path 31 of the lower cap 30 to be supplied to the liquid delivery element 40.

A delivery pipe 60 may be arranged inside the liquid storage 21 and may provide a passage for deliver an aerosol generated in a chamber 49 to the discharge hole 22*a*. For example, one end of the delivery pipe 60 is connected to the chamber 49, and the other end of the delivery pipe 60 is connected to the discharge hole 22*a* of the mouthpiece 22. Referring to FIG. 4B, a path through which an aerosol generated in the chamber 49 is moved is indicated by arrows. The aerosol may be delivered to the discharge hole 22*a* through the delivery pipe 60.

Meanwhile, according to the embodiment shown in FIGS. 4A and 4B, the delivery pipe 60 is arranged on a central axis line of the liquid storage 21 in a longitudinal direction in which the liquid storage 21 extends. However, a position of the delivery pipe 60 is not limited thereto, and for example, the delivery pipe 60 may be arranged to be closer to an edge of the liquid storage 21.

A pressurizer 70 is arranged between the delivery pipe 60 and the liquid delivery element 40. The pressurizer 70 is arranged between one end of the delivery pipe 60 facing the chamber 49 and the liquid delivery element 40 to perform a function of pressurizing the liquid delivery element 40 in a direction toward the lower cap 30.

The pressurizer 70 includes a material with elasticity such as rubber or silicone, and the pressurizer 70 is arranged in a compressed state between the delivery pipe 60 and the liquid delivery element 40, such that the pressurizer 70 may firmly pressurize the liquid delivery element 40. Due to the pressure of the pressurizer 70, the liquid delivery unit 40 may be stably fixed to the chamber 49 of the lower cap 30 during smoking.

The pressurizer 70 includes a connection pipe 71 that surrounds one end (i.e., bottom end) of the delivery pipe 60 and connects the one end of the delivery pipe 60 to the chamber 49, The delivery pipe 60 includes a flange protruding from the outside of the delivery pipe 60 such that the flange is caught by the connection pipe 71 of the pressurizer 70.

The liquid storage 21 includes a support pipe 21*w* that surrounds the other end (i.e., top end) of the delivery pipe 60, thereby connecting the top end of the delivery pipe 60 to the discharge hole 22*a*. As shown in FIG. 4B, the delivery pipe 60 may include another flange to be caught by the support pipe 21*w*. As such, the delivery pipe 60 may be firmly supported between the chamber 49 and the discharge hole 22*a* by flanges formed at both ends of the delivery pipe 60.

The pressurizer 70 includes a contact portion 72 extending from the connection pipe 71 toward the liquid delivery element 40 and directly contacts the liquid delivery element 40. An aerosol generating material accommodated in the liquid storage 21 may be delivered to the liquid delivery element 40 through the material delivery hole 73 which provides fluid communication between the storage space 23 and the chamber 49. The liquid delivery element 40 may be formed in a substantially cylindrical shape, and a surface of the contact portion 72 in contact with the liquid delivery element 40 may have a curved shape to correspond to a shape of an outer surface of the liquid delivery element 40.

Terminals 21*t* for providing electrical connection with a main body may be installed at a lower end of the liquid storage 21 of the cartridge 20 and may be exposed to the outside. For example, the terminals 21*t* may be installed at a lower end of the lower cap 30 and may be exposed to the outside of the lower cap 30 for electrical connection to the main body. The terminals 21*t* perform a function of delivering electricity supplied from the main body to the heater 50. The terminals 21*t* include coupling pipes 21*p* that protrude toward the chamber 49 by penetrating terminal paths 36 of the lower cap 30. The coupling pipes 21*p* are firmly coupled to ends of the heater 50.

FIG. 5 is a block diagram illustrating hardware components of the aerosol generating device according to an embodiment.

Referring to FIG. 5, the aerosol generating device 1 may include a battery 410, a heater 420, a sensor 430, a user interface 440, a memory 450, and a processor 460. However, the internal structure of the aerosol generating device 1 is not limited to the structures illustrated in FIG. 5. According to the design of the aerosol generating device 1, it will be understood by one of ordinary skill in the art that some of the hardware components shown in FIG. 5 may be omitted or new components may be added.

In an embodiment, the aerosol generating device 1 may consist of only a main body without a cartridge, in which case hardware components included in the aerosol generating device I are located in the main body. In another embodiment, the aerosol generating device 1 may include a main body and a cartridge, in which case hardware components included in the aerosol generating device fare located separately in the main body and the cartridge. Alternatively, at least some of hardware components included in the aerosol generating device 1 may be located respectively in the main body and the cartridge.

Hereinafter, an operation of each of the components will be described without being limited to the location in the aerosol generating device 1.

The battery 410 supplies power to be used for the aerosol generating device I to operate In other words, the battery 410 may supply power such that the heater 420 may be heated. In addition, the battery 410 may supply power required for operation of other hardware components included in the aerosol generating device 1, such as the sensor 430, the user interface 440, the memory 450, and the controller 460. The battery 410 may be a rechargeable battery or a disposable battery. For example, the battery 410 may be a lithium polymer (LiPoly) battery, but is not limited thereto.

The heater 420 receives power from the battery 410 under the control of the controller 460, The heater 420 may receive power from the battery 410 and heat a cigarette inserted into the aerosol generating device 1, or heat the cartridge mounted on the aerosol generating device 1.

The heater 420 may be located in the main body of the aerosol generating device 1. Alternatively, when the aerosol generating device 1 consists of the main body and the cartridge, the heater 420 may be located in the cartridge. When the heater 420 is located in the cartridge, the heater 420 may receive power from the battery 410 located in at least one of the main body and the cartridge.

The heater 420 may be formed of any suitable electrically resistive material. For example, the suitable electrically resistive material may be a metal or a metal alloy including titanium, zirconium, tantalum, platinum, nickel, cobalt, chromium, hafnium, niobium, molybdenum, tungsten, tin, gallium, manganese, iron, copper, stainless steel, or nichrome, but is not limited thereto. In addition, the heater 420 may be implemented by a metal wire, a metal plate on which an electrically conductive track is arranged, or a ceramic heating element, but is not limited thereto.

In an embodiment, the heater 420 may be a component included in the cartridge. The cartridge may include the heater 420, the liquid delivery element, and the liquid storage. The aerosol generating material accommodated in the liquid storage may be absorbed by the liquid delivery element, and the heater 420 may heat the aerosol generating material absorbed by the liquid delivery element, thereby generating aerosol. For example, the heater 420 may include a material such as nickel chromium and may be wound around or arranged adjacent to the liquid delivery element.

In another embodiment, the heater 420 may heat the cigarette inserted into the accommodation space of the aerosol generating device 1. As the cigarette is accommodated in the accommodation space of the aerosol generating device 1, the heater 420 may be located inside and/or outside the cigarette. Accordingly, the heater 420 may generate aerosol by heating the aerosol generating material in the cigarette.

Meanwhile, the heater 420 may include an induction heater. The beater 420 may include an electrically conductive coil for heating an aerosol generating article in an induction heating method, and the aerosol generating article or the cartridge may include a susceptor which may be heated by the induction heater.

The aerosol generating device 1 may include at least one sensor 430. A result sensed by the at least one sensor 430 is transmitted to the controller 460, and the controller 460 may control the aerosol generating device I to perform various functions such as controlling the operation of the heater, restricting smoking, determining whether a cigarette (or a cartridge) is inserted, and displaying a notification.

For example, the at least one sensor 430 may include a puff detecting sensor. The puff detecting sensor may detect a user's puff based on any one of a temperature change, a flow change, a voltage change, and a pressure change.

In addition, the at least one sensor 430 may include a temperature detecting sensor. The temperature detecting sensor may detect the temperature at which the heater 420 (or an aerosol generating material) is heated. The aerosol generating device I may include a separate temperature detecting sensor for sensing a temperature of the heater 420, or the heater 420 itself may serve as a temperature detecting sensor instead of including a separate temperature detecting sensor. Alternatively, a separate temperature detecting sensor may be further included in the aerosol generating device I while the heater 420 serves as a temperature detecting sensor.

In addition, the at least one sensor 430 may include a position change detecting sensor. The position change detecting sensor may detect a change in a position of the slider coupled to the main body to move with respect to the main body.

The user interface 440 may provide the user with information about the state of the aerosol generating device 1. The user interface 440 may include various interfacing devices, such as a display or a light emitter for outputting visual information, a motor for outputting haptic information, a speaker for outputting sound information, input/output (I/O)) interfacing devices (e.g., a button or a touch screen) for receiving information input from the user or outputting information to the user, terminals for performing data communication or receiving charging power, and communication interfacing modules for performing wireless communication (e.g., Wi-Fi, Wi-Fi direct, Bluetooth, near-field communication (NFC), etc.) with external devices.

The aerosol generating device 1 may be implemented by selecting only some of the above-described examples of various user interface 440.

The memory 450, as a hardware component configured to store various pieces of data processed in the aerosol generating device 1, may store data processed or to be processed by the controller 460. The memory 450 may include various types of memories, such as random access memory (RAM) (e.g., dynamic random access memory (DRAM) and static random access memory (SRAM), etc.), read-only memory (ROM), electrically erasable programmable read-only memory (EEPROM), etc.

The memory 450 may store an operation time of the aerosol generating device 1, the maximum number of puffs, the current number of puffs, at least one temperature profile, data on a user's smoking pattern, etc. The memory may store computer code that is configured to, when executed by the processor 406, cause the processor 460 to perform its functions as described in the present disclosure.

The processor 460 may control overall operations of the aerosol generating device 1. The processor 460 can be implemented as an array of a plurality of logic gates or can be implemented as a combination of a general-purpose microprocessor and a memory in which a program executable in the microprocessor is stored. It will be understood by one of ordinary skill in the art that the processor 460 can be implemented in other forms of hardware.

The processor 460 analyzes a result of the sensing by at least one sensor 430, and controls the processes that are to be performed subsequently.

The processor 460 may control power supplied to the heater 420 so that the operation of the heater 420 is started or terminated, based on the result of the sensing by the at least one sensor 430. In addition, based on the result of the sensing by the at least one sensor 430, the processor 460 may control the amount of power supplied to the heater 420 and the time at which the power is supplied, so that the heater 420 is heated to a predetermined temperature or maintained at an appropriate temperature.

In an embodiment, the processor 460 may set a mode of the heater 420 to a pre-beating mode to start the operation of the heater 420 after receiving a user input to the aerosol generating device 1. In addition, the processor 460 may switch the mode of the heater 420 from the pre-heating mode to an operation mode after detecting a user's puff by using the puff detecting sensor. In addition, the processor 460 may stop supplying power to the heater 420 when the number of puffs reaches a preset number after counting the number of puffs by using the puff detecting sensor.

The processor 460 may control the user interface 440 based on the result of the sensing by the at least one sensor 430. For example, when the number of puffs reaches the preset number after counting the number of puffs by using the puff detecting sensor, the processor 460 may notify the user by using at least one of a light emitter, a motor, or a speaker that the aerosol generating device 1 will soon be terminated.

Although not illustrated in FIG. 5, the aerosol generating device 1 may form an aerosol generating system together with an additional cradle. For example, the cradle may be used to charge the battery 410 of the aerosol generating device I. For example, while the aerosol generating device I is accommodated in an accommodation space of the cradle, the aerosol generating device 1 may receive power from a battery of the cradle such that the battery 410 of the aerosol generating device 1 may be charged.

As described above with reference to FIG. 2, a user may check the remaining amount of an aerosol generating material through the protruding window **21*a* of the cartridge. However, due to the degree of inclination of the aerosol generating apparatus 1**, a dark surrounding environment, and so on, a user may not accurately determine the remaining amount.

The aerosol generating apparatus 1 according to an embodiment determines the remaining amount of the aerosol generating material by using an electronic element of an internal circuit. For example, the aerosol generating apparatus I may detect the remaining amount of the aerosol generating material by using a fixed resistor included in the internal circuit. Here, the fixed resistor indicates a resistor having a resistance value that does not vary, especially by a temperature of the heater 420.

The electronic cigarette of the related art employs a technique for detecting the remaining amount of an aerosol generating material depending on a temperature of a heater. Specifically, the electronic cigarette of the related art uses a technique for detecting the remaining amount of an aerosol generating material based on a change in resistance according to a temperature of a heater. However, a remaining amount of the aerosol generating material that is detected according to the temperature of the heater may be different from an actual remaining amount, because the temperature of the heater may be affected by various factors.

The aerosol generating apparatus 1 according to an embodiment detects a remaining amount of an aerosol generating material by using a fixed resistor that is not affected by a temperature of a heater. Accordingly, the remaining amount of the aerosol generating material in the electronic cigarette may be detected accurately.

In addition, when an aerosol generating material in the cartridge 20 is depleted, the aerosol generating apparatus I may output a notification signal. Accordingly, a user may be notified of a timing for replacing the cartridge 20 or replenishing the aerosol generating material in the cartridge 20.

Hereinafter, an example in which the aerosol generating apparatus I detects a remaining amount of an aerosol generating material will be described with reference to FIGS. 6 to 9.

FIG. 6 is a block diagram showing an example of an aerosol generating apparatus according to an embodiment.

Referring to FIG. 6, the aerosol generating apparatus 1 includes the cartridge 20, a processor 460 and an electronic circuit 470. In addition, the cartridge 20 includes the liquid storage 21 and the heater 420.

In FIG. 6, only some components of the aerosol generating apparatus 1 are shown for the sake of convenient description. Therefore, it can be easily understood by those skilled in the art that other components described above with reference to FIGS. 1 to 5 may also be included in the aerosol generating apparatus 1 of FIG. 6.

The cartridge 20 and the processor 460 of FIG. 6 are described above with reference to FIGS. 1 to 5. Accordingly, hereinafter, descriptions of the cartridge 20 and the processor 460 that are the same as those given above with reference to FIGS. 1 to 5 are omitted.

The electronic circuit 470 is connected to the cartridge 20 and the processor 460. For example, the electronic circuit 470 may be an integrated circuit (IC) that enables the heater 420 to perform heating. The electronic circuit 470 supplies power from the battery 410 to the heater 420 according to a command transmitted from the processor 460. In other words, the electronic circuit 470 may include a plurality of electronic elements to supply power corresponding to a command of the processor 460 to the heater 420. For example, the command of the processor 460 may be a pulse width modulation control signal, but it is not limited thereto.

In addition, the electronic circuit 470 may include a fixed resistor. Here, the fixed resistor is used to detect a remaining amount of an aerosol generating material accommodated in the cartridge 20, and a resistance value thereof is not changed by temperature. For example, the resistance value of the fixed resistor may be less than or equal to 5Ω, but it is not limited thereto.

The processor 460 detects the remaining amount of the aerosol generating material by using the fixed resistor included in the electronic circuit 470. For example, the processor 460 may detect the remaining amount based on a voltage across the fixed resistor. In this case, the fixed resistor does not change the resistance value according to a temperature of the heater 420. Accordingly, even when the temperature of the heater 420 varies due to an external factor that does not cause consumption of the aerosol generating material, the processor 460 may accurately detect the remaining amount of the aerosol generating material.

Hereinafter, implementation examples of the electronic circuit 470 will be described with reference to FIGS. 7 and 8.

FIG. 7 is a diagram showing an example of an electronic circuit according to an embodiment.

FIG. 7 shows some of components included in the electronic circuit 470. As described above with reference to FIG. 6, the electronic circuit 470 supplies power to the heater 420 according to a command of the processor 460. Accordingly, the electronic circuit 470 may consist of a plurality of electronic elements to execute a command of the processor 460.

In particular, the electronic circuit 470 includes a fixed resistor $R_0$. For example, the fixed resistor $R_0$ are connected to terminals $T_0$ and $T_1$, and the processor 460 may acquire a voltage across the fixed resistor $R_0$ through the terminals $T_0$ and $T_1$. The connection relationship between the fixed resistor $R_0$ and the terminals $T_0$ and $T_1$ shown in FIG. 6 is an example. That is, the fixed resistor $R_0$ may be directly connected to the terminals $T_0$ and $T_1$, or another electronic element may be arranged between the fixed resistor $R_0$ and the terminals $T_0$ and $T_1$.

The processor 460 detects a remaining amount of an aerosol generating material based on the voltage across the fixed resistor $R_0$. For example, the processor 460 may determine the remaining amount of the aerosol generating material corresponding to the voltage across the fixed resistor $R_0$ based on a lookup table stored in a memory 450.

A resistance value of the fixed resistor $R_0$ is not affected by a temperature of the heater 420. In other words, the fixed resistor $R_0$ may be included in the electronic circuit 470 only for the purpose of detecting the remaining amount of the aerosol generating material. For example, the resistance value of the fixed resistor $R_0$, may be less than or equal to 5Ω. Preferably, the resistance value of the fixed resistor $R_0$ may be in a range of 4.5Ω to 5Ω, but it is not limited thereto.

The electronic circuit 470 includes a terminal $T_3$ related to power supplied to the fixed resistor $R_0$ and a terminal $T_4$ related to power supplied to the heater 420. In other words, the processor 460 transmits a command (hereinafter "first command") for acquiring a voltage across the fixed resistor $R_0$ through the terminal $T_3$. In addition, the processor 460 transmits through the terminal $T_4$ a command (hereinafter "second command") for the heater 420 to perform heating. For example, commands transmitted to the terminals $T_3$ and $T_4$ by the processor 460 may include pulse width modulation control signals.

The processor 460 transmits the second command through the terminal $T_4$ to the electronic circuit 470 to control the aerosol generating apparatus to generate an aerosol. Then, the electronic circuit 470 supplies power to the heater 420 according to a command transmitted through the terminal $T_4$. As a result, the heater 420 performs heating and the aerosol generating material is vaporized. According to the related art, the remaining amount of the aerosol generating material is estimated based on a resistance value that changes as the heater 420 performs heating. In this case, the estimated amount of the aerosol generating material may not be accurate because irrelevant factors that causes heating of the heater 420 but are not related to consumption of the aerosol generating material may also be reflected in estimating the remaining amount of the aerosol generating material.

The electronic circuit 470 includes the fixed resistor $R_0$, and the processor 460 transmits a first command for acquiring a voltage across the fixed resistor $R_0$ through the terminal $T_3$. That is, the voltage across the fixed resistor $R_0$ entirely depends only on the command transmitted through the terminal $T_3$. Accordingly, the processor 460 may accurately detect the remaining amount of the aerosol generating material.

Meanwhile, the processor 460 may generate differently a first command transmitted through the terminal $T_3$ and a second command transmitted through the terminal $T_4$. Specifically, the first command and the second command may be transmitted at different times, and the amount of power applied to the fixed resistor $R_0$ according to the first command and the amount of power applied to the heater 420 according to the second command may be different from each other.

For example, the processor 460 may intermittently transmit the second command to the electronic circuit 470. In addition, the processor 460 may transmit the first command to the electronic circuit 470 during time periods in which the second command is not transmitted to the electronic circuit 470. Also, the signal power of the first command may be less than the signal power of the second command. Accordingly, the remaining amount of the aerosol generating material may be detected based on the first command using a small amount of power of the battery 410 without affecting heating of the heater 420.

FIG. 8 is a diagram showing another example of the electronic circuit according to the embodiment.

FIG. 8 shows a specific example of the electronic circuit 470 shown in FIG. 7. However, the circuit diagram shown in FIG. 8 is only an example of the electronic circuit 470, and other electronic elements may be further included therein, or some of the electronic elements shown in FIG. 8 may be omitted.

FIG. 8 further includes a terminal $T_E$ as well as the terminals $T_0$, $T_1$, $T_3$, and $T_4$ described above with reference to FIG. 7. For example, the terminal $T_E$ may be related to power supplied to the heater 420. That is, an electrical parameter corresponding to a temperature of the heater 420 may be acquired through the terminal $T_E$. In the related art, a remaining amount of an aerosol generating material is generally estimated by using a resistance value (or a voltage value) detected through the terminal $T_E$. However, the processor 460 according to an embodiment may detect the remaining amount of the aerosol generating material based on a voltage across the fixed resistor $R_0$ which may be detected through the terminals $T_0$ and $T_1$. Accordingly, the processor 460 may accurately detect the remaining amount of the aerosol generating material, regardless of the degree of heating by the heater 420 and a factor that affects the temperature of the heater 420.

FIG. 9 is a flowchart showing an example of a method of controlling an aerosol generating apparatus, according to an embodiment.

Referring to FIG. 9, the method of controlling the aerosol generating apparatus includes steps processed by the processor 460 described above with reference to FIGS. 1 to 8. Accordingly, it can be seen that, even though descriptions are omitted below, the descriptions of the processor 460 may also apply to the method of controlling the aerosol generating apparatus of FIG. 9.

In step 910, the processor 460 transmits a pulse width modulation control signal to the electronic circuit 470 connected to the cartridge 20.

Here, the pulse width modulation control signal may be a command for supplying power to the fixed resistor $R_0$ included in the electronic circuit 470. Meanwhile, the pulse width modulation control signal transmitted in step 910 and a control signal for supplying power to the heater 420 may differ from each other in not only a time when the control signals are transmitted, but also in the amount of power of the control signals.

In step 920, the processor 460 acquires a voltage across the fixed resistor $R_0$ included in the electronic circuit 470.

For example, the processor 460 acquires the voltage across the fixed resistor $R_0$ that is generated according to the power transmitted in step 910. In this case, a resistance value of the fixed resistor $R_0$ is not affected by a temperature of the heater 420.

In step 930, the processor 460 detects a remaining amount of an aerosol generating material accommodated in the cartridge 20 based on the voltage acquired in step 920.

For example, the processor 460 may determine the remaining amount of the aerosol generating material corresponding to the voltage across the fixed resistor $R_0$ based on the lookup table stored in the memory 450.

Meanwhile, although not shown in FIG. 9, the processor 460 may generate a notification signal when the aerosol generating material in the cartridge 20 is depleted. In addition, the processor 460 may output the notification signal through a user interface 440.

A character or a specific color indicating that the aerosol generating material is depleted may be output to the user interface 440. Also, the user interface 440 may also blink according to a predetermined pattern. Also, the user interface 440 may also output a sound or a vibration indicating that the aerosol generating material is depleted.

As described above, the aerosol generating apparatus 1 detects a remaining amount of an aerosol generating material by using an internal fixed resistor. Accordingly, even when a temperature of the heater 420 varies due to external factors that do not affect the consumption of the aerosol generating material, the aerosol generating apparatus 1 may accurately detect the remaining amount of the aerosol generating material.

Meanwhile, the above-described method may also be implemented in the form of a recording medium including commands executable by a computer such as a program module executed by a computer. A computer-readable recording medium may be any available medium that can be accessed by a computer and includes both volatile and nonvolatile media, and removable and non-removable media. In addition, the computer-readable recording medium may include both a computer storage medium and a communication medium. The computer storage medium includes all of volatile and nonvolatile, and removable and non-removable media implemented by any method or technology for storage of information such as computer-readable instructions, data structures, program modules or other data. The communication medium typically includes computer-readable instructions, data structures, other data in modulated data signals such as program modules, or other transmission mechanisms, and includes any information transfer media.

At least one of the components, elements, modules or units (collectively "components" in this paragraph) represented by a block in the drawings may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

Those skilled in the art related to the present embodiments may understand that various changes in form and details may be made therein without departing from the scope of the characteristics described above. Therefore, the disclosed methods should be considered from an explanatory point of view rather than a limiting point of view, and the scope of the rights is shown in the claims rather than the above description, and should be interpreted as including all differences within the scope equivalent thereto.

The invention claimed is:

1. An aerosol generating apparatus comprising:

a cartridge configured to accommodate an aerosol generating material;

a processor; and an electronic circuit connected to the cartridge and the processor, wherein the processor is configured to detect a remaining amount of the aerosol generating material by using a fixed resistor included in the electronic circuit, the fixed resistor being connected between a first terminal and a second terminal, and the remaining amount is detected based on a voltage value across the fixed resistor, wherein a resistance value of the fixed resistor is independent of a temperature of a heater included in the cartridge, wherein the electronic circuit includes a third terminal for transmitting a first signal for controlling power supplied to the heater of the cartridge, and a fourth terminal for transmitting a second signal for controlling power supplied to the fixed resistor, wherein an amount of power applied according to the first signal is different than the amount of power applied according to the second signal, wherein the first signal and the second signal are provided at different times, and wherein the processor is further configured to determine the remaining amount of the aerosol generating material corresponding to the voltage value across the fixed resistor based on a lookup table stored in a memory.

2. The aerosol generating apparatus of claim 1, wherein the first signal is a pulse width modulation (PWM) signal.

3. The aerosol generating apparatus of claim 1, wherein the second signal is a PWM signal.

4. The aerosol generating apparatus of claim 1, wherein the resistance value of the fixed resistor is less than or equal to 5Ω.

5. The aerosol generating apparatus of claim 1, wherein the processor generates a notification signal when the aerosol generating material is depleted in the cartridge.

6. The aerosol generating apparatus of claim 1, wherein the heater is configured to vaporize the aerosol generating material, wherein the aerosol generating apparatus further comprises a liquid delivery element configured to deliver the aerosol generating material to the heater, and wherein the heater is wound around an outer circumferential surface of the liquid delivery element.

* * * * *